United States Patent
Chen et al.

(10) Patent No.: US 9,305,856 B2
(45) Date of Patent: Apr. 5, 2016

(54) POST-PASSIVATION INTERCONNECT STRUCTURE AMD METHOD OF FORMING SAME

(75) Inventors: Hsien-Wei Chen, Hsinchu (TW); Yi-Wen Wu, Xizhi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 351 days.

(21) Appl. No.: 13/370,895

(22) Filed: Feb. 10, 2012

(65) Prior Publication Data
US 2013/0207258 A1    Aug. 15, 2013

(51) Int. Cl.
*H01L 23/48* (2006.01)
*H01L 23/31* (2006.01)
*H01L 23/00* (2006.01)

(52) U.S. Cl.
CPC ........ *H01L 23/3171* (2013.01); *H01L 23/3114* (2013.01); *H01L 23/3192* (2013.01); *H01L 23/564* (2013.01); *H01L 24/05* (2013.01); *H01L 24/03* (2013.01); *H01L 24/11* (2013.01); *H01L 24/13* (2013.01); *H01L 2224/0345* (2013.01); *H01L 2224/0346* (2013.01); *H01L 2224/03452* (2013.01); *H01L 2224/0401* (2013.01); *H01L 2224/05008* (2013.01); *H01L 2224/05022* (2013.01); *H01L 2224/05124* (2013.01); *H01L 2224/05147* (2013.01); *H01L 2224/05572* (2013.01); *H01L 2224/05611* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/05686* (2013.01); *H01L 2224/1146* (2013.01); *H01L 2224/131* (2013.01); *H01L 2224/13022* (2013.01); *H01L 2224/13144* (2013.01); *H01L 2224/13147* (2013.01); *H01L 2224/13155* (2013.01); *H01L 2224/16237* (2013.01); *H01L 2224/81011* (2013.01); *H01L 2224/8191* (2013.01);

(Continued)

(58) Field of Classification Search
CPC .............. H01L 23/564; H01L 23/3171; H01L 23/3114; H01L 24/11; H01L 24/12; H01L 24/05
USPC ........................................................ 257/737
See application file for complete search history.

(56) References Cited

U.S. PATENT DOCUMENTS 5,925,931 A * 7/1999 Yamamoto ..................... 257/737
6,573,584 B1 * 6/2003 Nagakari et al. ............... 257/528
(Continued)

FOREIGN PATENT DOCUMENTS

CN           101636831           1/2010

OTHER PUBLICATIONS

German Office Action issued on Jul. 23, 2012.
(Continued)

*Primary Examiner* — Nicholas Tobergte
(74) *Attorney, Agent, or Firm* — Slater & Matsil, L.L.P.

(57) ABSTRACT

A semiconductor device including a dielectric layer formed on the surface of a post-passivation interconnect (PPI) structures. A polymer layer is formed on the dielectric layer and patterned with an opening to expose a portion of the dielectric layer. The exposed portion of the dielectric layer is then removed to expose a portion of the PPI structure. A solder bump is then formed over and electrically connected to the first portion of the PPI structure.

20 Claims, 4 Drawing Sheets

(52) U.S. Cl.
CPC ........... *H01L 2224/81191* (2013.01); *H01L 2224/81411* (2013.01); *H01L 2224/81413* (2013.01); *H01L 2224/81416* (2013.01); *H01L 2224/81439* (2013.01); *H01L 2224/81447* (2013.01); *H01L 2224/81455* (2013.01); *H01L 2224/81815* (2013.01); *H01L 2924/00014* (2013.01)

(56) References Cited

U.S. PATENT DOCUMENTS

| | | | | |
|---|---|---|---|---|
| 6,753,208 | B1* | 6/2004 | MacIntyre | 438/118 |
| 7,387,827 | B2* | 6/2008 | Sterrett et al. | 428/131 |
| 7,494,912 | B2* | 2/2009 | Coolbaugh et al. | 438/612 |
| 7,573,117 | B2* | 8/2009 | Chinthakindi et al. | 257/528 |
| 7,897,414 | B2* | 3/2011 | Nagai | 438/3 |
| 7,977,783 | B1 | 7/2011 | Park et al. | |
| 8,581,400 | B2* | 11/2013 | Liang et al. | 257/737 |
| 2002/0005583 | A1* | 1/2002 | Harada et al. | 257/758 |
| 2008/0308934 | A1* | 12/2008 | Alvarado et al. | 257/738 |
| 2009/0026608 | A1* | 1/2009 | Tsai et al. | 257/737 |
| 2010/0140752 | A1 | 6/2010 | Marimuthu et al. | |
| 2011/0049705 | A1 | 3/2011 | Liu et al. | |
| 2011/0101520 | A1 | 5/2011 | Liu et al. | |
| 2011/0198748 | A1* | 8/2011 | Koike | 257/737 |

OTHER PUBLICATIONS

Office Action dated Sep. 19, 2014 and English Translation from corresponding No. DE 10 2012 104 730.8.

* cited by examiner

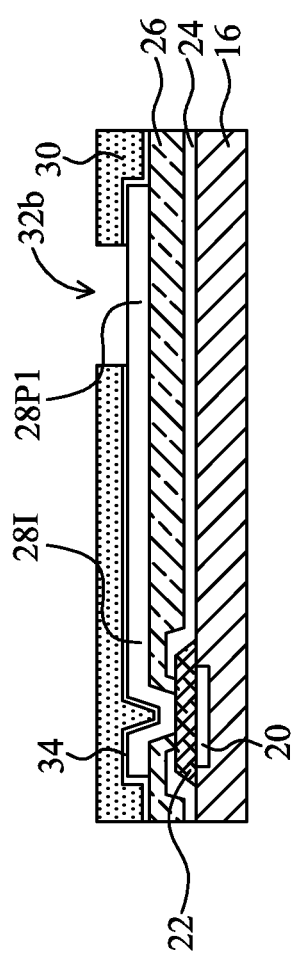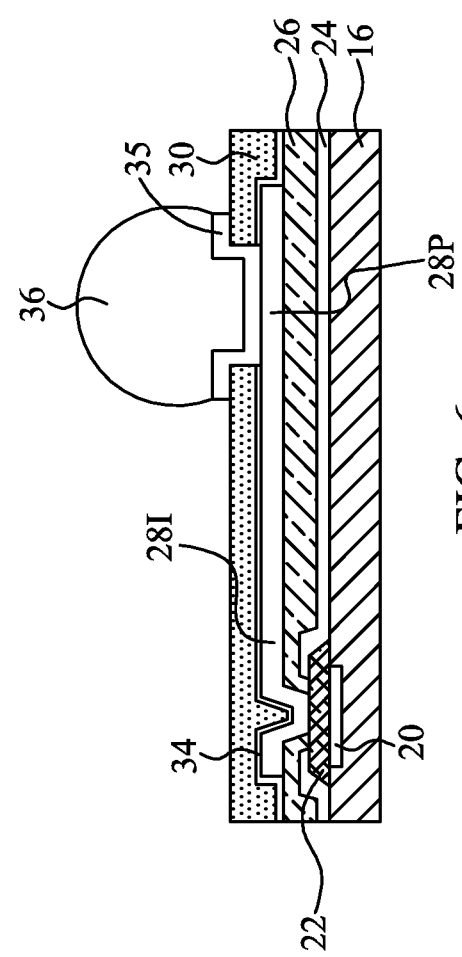
FIG. 5
FIG. 6

POST-PASSIVATION INTERCONNECT STRUCTURE AMD METHOD OF FORMING SAME

TECHNICAL FIELD

This disclosure relates to the fabrication of semiconductor devices and, more particularly, to the fabrication of a post-passivation interconnect (PPI) structure.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of a respective chip. Electrical connections are made through bond pads to connect the chip to a package substrate or another die. Bond pads can be used for wire bonding or flip-chip packaging. Flip-chip packaging utilizes bumps to establish electrical contact between the chip's input/output (I/O) pads and the package substrate or lead frame of the package. Structurally, the bump actually contains the bump itself and an "under bump metallurgy" (UBM) located between the bump and the I/O pad.

Wafer level chip scale packaging (WLCSP) is currently widely due to low cost and relatively simple processes in comparison to other packing processes. In a typical WLCSP, post-passivation interconnect (PPI) lines such as redistribution lines (RDLs) are formed on passivation layers, followed by the formation of polymer films and bumps. An interface between the bump and the polymer layer, however, has poor adhesion and suffers moisture attack, which may induce delamination in polymer layers.

BRIEF DESCRIPTION OF THE DRAWINGS

FIGS. 1-6 are cross-sectional views of illustrating various intermediate stages of a method of forming a semiconductor device having a post-passivation interconnect (PPI) structure in accordance with exemplary embodiments.

DETAILED DESCRIPTION

Figure 1:
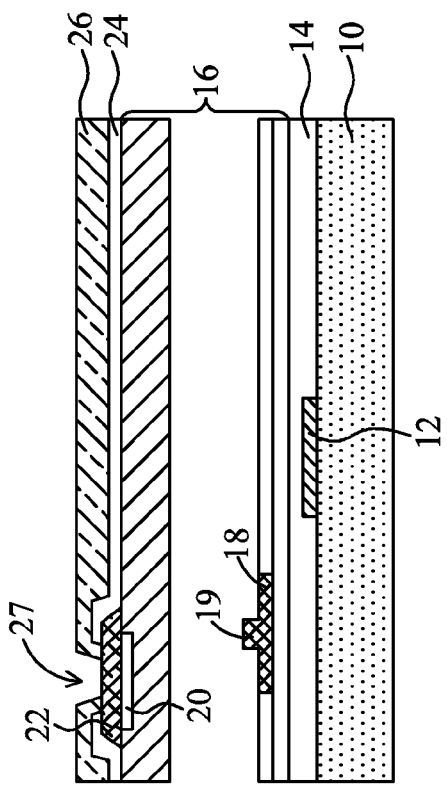

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Embodiments described herein relate to the use of bump structures for use with semiconductor devices. As will be discussed below, embodiments are disclosed that utilize a bump structure for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-6 illustrate various intermediate stages of a method of forming a semiconductor device in accordance with some embodiments. Referring first to FIG. 1, a portion of a substrate 10 having electrical circuitry formed thereon is shown, in accordance with some embodiments. The substrate 10 may comprise, for example, bulk silicon, doped or undoped, or an active layer of a semiconductor-on-insulator (SOI) substrate. The substrate 10 may be provided as a wafer level scale or a chip level scale. Other substrates, such as a multi-layered or gradient substrate may also be used.

Electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 14. The ILD layer 14 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the ILD layer 14 comprises a plurality of dielectric layers. Contacts (not shown) may be formed through the ILD layer 14 to provide an electrical contact to the electrical circuitry 12.

One or more inter-metal dielectric (IMD) layers 16 and associated metallization layers are formed over the ILD layer 14. Generally, the one or more IMD layers 16 and the associated metallization layers (such as metal lines 18 and vias 19) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. In some embodiments, one or more etch stop layers (not shown) are positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In some embodiments, etch stop layers are formed of SiN, SiCN, SiCO, CN, combinations thereof, or the like, deposited by CVD or PECVD techniques.

In some embodiments, the metallization layers including metal lines 18 and vias 19 are formed of copper or copper alloys, or of other metals. Further, the metallization layers include a top metal layer 20 formed and patterned in or on an uppermost IMD layer to provide external electrical connections and to protect underlying layers from various environmental contaminants. In some embodiments, the uppermost IMD layer is formed of a dielectric material, such as silicon nitride, silicon oxide, undoped silicon glass, and the like. In subsequent drawings, semiconductor substrate 10, electrical circuitry 12, ILD layer 14, and metallization layers 18 and 19 are not illustrated. In some embodiments, the top metal layer 20 is formed as a part of the top metallization layer on the uppermost IMD layer.

Thereafter, a conductive pad 22 is formed and patterned to contact the top metal layer 20, or alternatively, electrically coupled to top metal layer 20 through a via. In some embodiments, the conductive pad 22 is formed of aluminum, aluminum copper, aluminum alloys, copper, copper alloys, or the like.

With reference to FIG. 1, one or more passivation layers, such as a passivation layer 24, are formed and patterned over the conductive pad 22. In some embodiments, the passivation layer 24 is formed of a dielectric material, such as undoped silicate glass (USG), silicon nitride, silicon oxide, silicon oxynitride or a non-porous material by any suitable method, such as CVD, PVD, or the like. The passivation layer 24 is formed to cover a peripheral portion of the conductive pad 22, and to expose a central portion of conductive pad 22 through an opening in passivation layer 24. The passivation layer 24 may be a single layer or a laminated layer. In FIG. 1, a single layer of conductive pad 22 and a passivation layer 24 are shown for illustrative purposes only. As such, other embodiments may include any number of conductive layers and/or passivation layers.

Next, a first protective layer 26 is formed and patterned over the passivation layer 24. In some embodiments, the first protective layer 26 is, for example, a polymer layer, which is patterned to form an opening 27, through which the conductive pad 22 is exposed. In some embodiments, the polymer layer is formed of a polymer material such as an epoxy, polyimide, benzocyclobutene (BCB), polybenzoxazole (PBO), and the like, although other relatively soft, organic, dielectric materials can also be used. Formation methods include spin coating or other methods. The first protective layer 26 has a thickness in a range between about 1 μm and about 10 μm. For example, a thickness between about 5 μm and about 8 μm.

Figure 2:
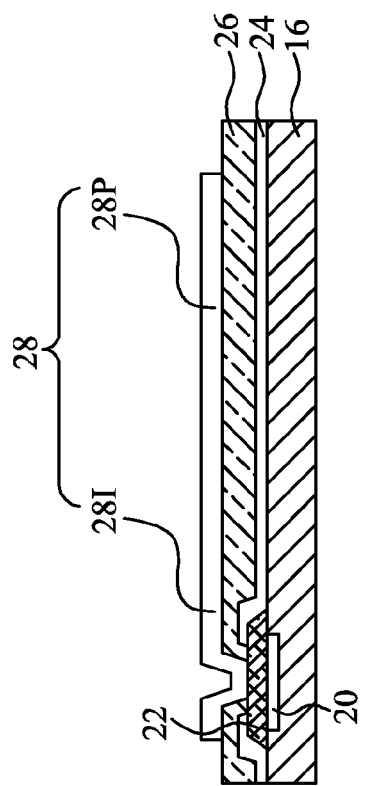

Referring to FIG. 2, at least one metallization layer is formed on the first protective layer 26 and fills the opening 27. The at least one metallization layer is then patterned as an intereconnect layer 28, which is electrically connected to the conductive pad 22 and may expose a portion of the underlying first protective layer 26. In at least an embodiment, the interconnect layer 28 is a post-passivation interconnect (PPI) structure 28, which may also function as power lines, redistribution lines (RDL), inductors, capacitors or any passive components. The PPI structure 28 includes an interconnect line region 28I and a landing pad region 28P. In some embodiments, the interconnect line region 28I and the landing pad region 28P are formed simultaneously, and are formed of a same conductive material. A bump feature will be formed over and electrically connected to the landing pad region 28P in subsequent processes. In some embodiments, the PPI structure 28 may include copper, aluminum, copper alloy, or other mobile conductive materials using plating, electroless plating, sputtering, chemical vapor deposition methods, and the like. In one embodiment, the PPI structure 28 includes a copper layer or a copper alloy layer. In the embodiment of FIG. 2, the landing region 28P is not directly over the conductive pad 22. In other embodiments, through the routing of PPI structure 28, the landing pad region 28P is directly over the conductive pad 22.

Figure 3:
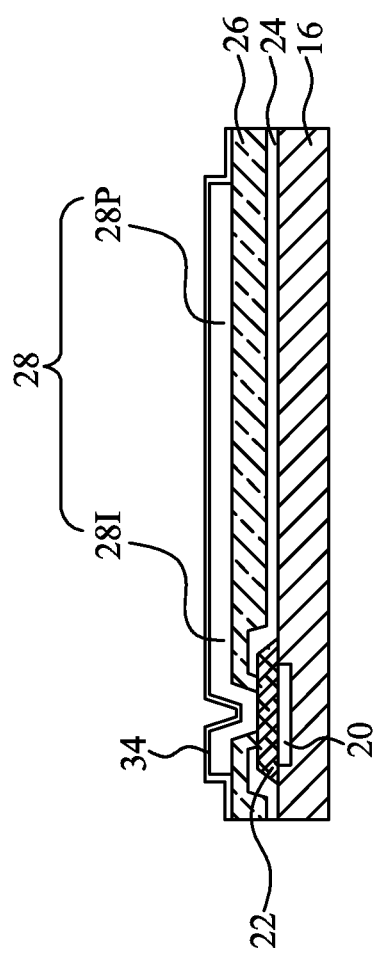

With reference to FIG. 3, a dielectric layer 34 is then formed on an entire surface to cover the PPI structure 28 and the exposed portion of the first protective layer 26. In some embodiments, the dielectric layer 34 is a nitride layer, for example a silicon nitride layer, a silicon oxynitride layer or the like. In some embodiments, the dielectric layer 34 functions as an anti-oxidation layer to prevent a surface of the PPI structure 28 from oxidation during subsequent processing so as to avoid leakage and increase device reliability. In some embodiments, the dielectric layer 34 also can function as an etch stop layer during subsequent etching process. In some embodiments, the dielectric layer 34 is less than or equal to about 3 μm thick, for example, from about 0.1 μm to about 3 μm thick. A formation method of the dielectric layer 34 includes a chemical vapor deposition (CVD) process, such as a low pressure CVD process.

Figure 4:
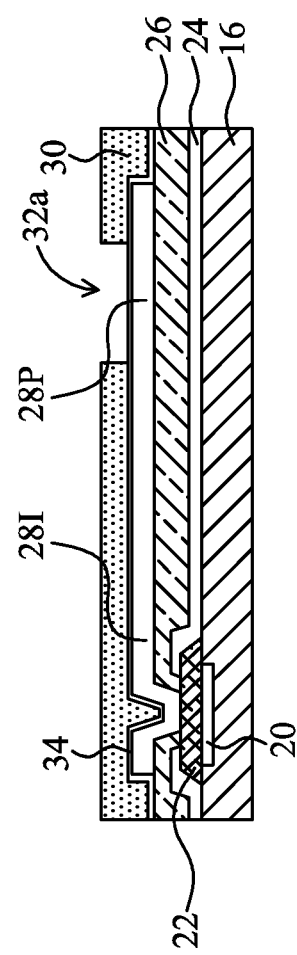

With reference to FIG. 4, a second protective layer 30 is then formed on the substrate 10 to cover the dielectric layer 34. Using photolithography and/or etching processes, the second protective layer 30 is patterned to form an opening 32a exposing at least a portion of the dielectric layer 34 within the landing pad region 28P of the PPI structure 28. Formation methods of the opening 32a include lithography, wet or dry etching, laser drilling, and the like. In some embodiments, the second protective layer 30 is formed of a polymer layer, such as an epoxy, polyimide, benzocyclobutene (BCB), polybenzoxazole (PBO), and the like, although other relatively soft, organic, dielectric materials may also be used. In some embodiments, the second protective layer 30 is formed of a non-organic material selected from un-doped silicate glass (USG), silicon nitride, silicon oxynitride, silicon oxide, and combinations thereof.

Next, as shown in FIG. 5, the exposed dielectric layer 34 is removed, resulting in an opening 32b exposing a portion 28P1 of the landing pad region 28P. An etching process is used to remove the exposed dielectric layer 34 by a self-aligned manner.

As shown in FIG. 6, an under bump metallization (UBM) layer 35 and a bump 36 are successively formed on the exposed potion 28P1 of the landing pad region 28P. The UBM layer 35 is formed in the opening 32b by using metal deposition, photolithography and etching methods. The UBM layer 35 may extend onto the second protective layer 30. In some embodiments, the UBM layer 35 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM layer 35 includes at least one Ti-containing layer and at least one Cu-containing layer.

The bump 36 can be a solder bump, a Cu bump or a metal bump including Ni or Au. In some embodiments, the bump 36 is a solder bump formed by attaching a solder ball to the UBM layer 35 in the opening 32b and then thermally reflowing the solder ball. In some embodiments, the solder bump includes a lead-free pre-solder layer, SnAg, or a solder material including alloys of tin, lead, silver, copper, nickel, bismuth, or combinations thereof. In some embodiments, the solder bump is formed by plating a solder layer with photolithography technologies followed by reflowing processes. In some embodiments, the bump 36 has a diameter of about 200 μm to about 300 μm. In other embodiments, the bump 36 has a diameter of about 100 μm to about 200 μm. In still other embodiments, the bump 36 has a diameter of about 50 μm to about 100 μm. In further embodiments, the bump 36 has a diameter of about 10 μm to about 50 μm. In some embodiments, the bump 36 includes "micro-bumps".

After the bump formation, an encapsulant may be formed, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 7:
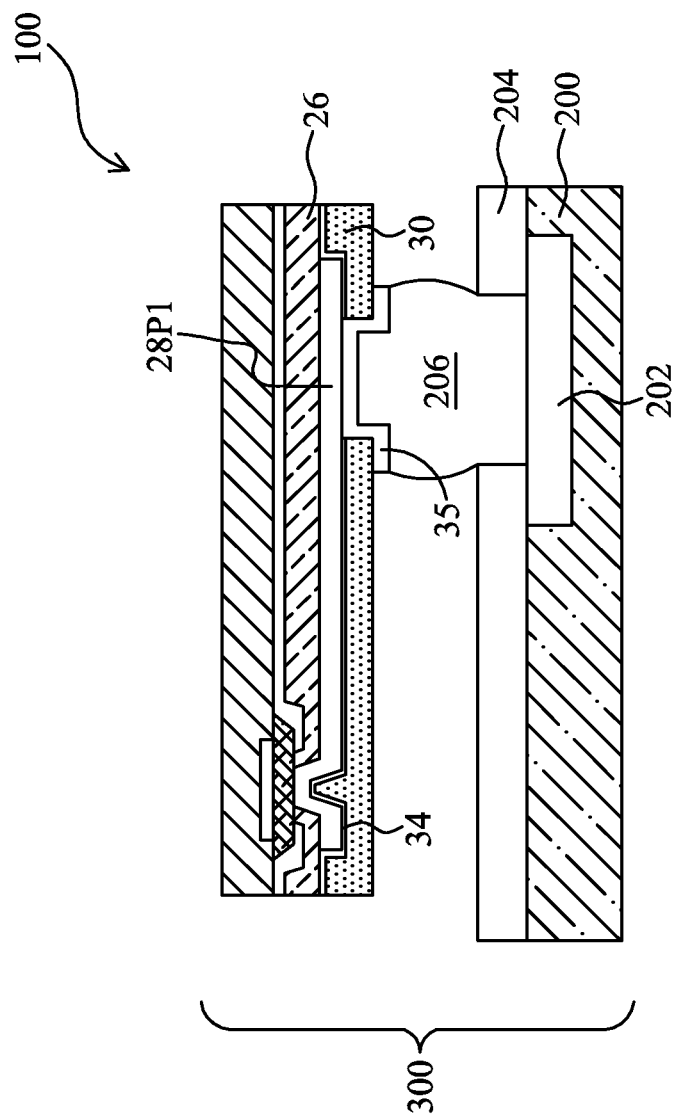
FIG. 7 is a cross-sectional view of a packaging assembly in accordance with an exemplary embodiment.

FIG. 7 is a cross-sectional diagram depicting an exemplary embodiment of a flip-chip assembly 300. The device 100 shown in FIG. 6 is flipped upside down and attached to another substrate 200. In some embodiments, the substrate 200 is a package substrate, board (e.g., a printed circuit board (PCB)), a wafer, a die, an interposer substrate, or other suitable substrate. The bump structure is coupled to the substrate 200 through various conductive attachment points. For example, a conductive region 202 is formed and patterned on the substrate 100. The conductive region 202 is a contact pad or a portion of a conductive trace, which is exposed by an opening in a mask layer 204. In some embodiments, the mask layer 204 is a solder resist layer formed and patterned on the substrate 200 to expose the conductive region 202. The mask layer 204 has a mask opening, which provides a window for solder joint formation. For example, a solder layer including alloys of tin, lead, silver, copper, nickel, bismuth, or combinations thereof may be provided on the conductive region 202. In some embodiments, the device 100 can be coupled to the substrate 200 to form a joint structure 206 between the landing pad region 28P and the conductive region 202. In some embodiments, the joint structure 206 is a solder joint structure. For example, a solder joint structure can be formed by a coupling process including a flux application, chip placement, reflowing of melting solder joints, and/or cleaning of flux residue. The device 100, the joint structure 206, and the substrate 200 may be referred to as a packaging assembly 300, or in the present embodiment, a flip-chip packaging assembly.

In accordance with one aspect of the exemplary embodiments, a semiconductor device includes a semiconductor substrate, a passivation layer overlying the semiconductor substrate, an interconnect layer overlying the passivation layer, a dielectric layer formed overlying the interconnect layer without covering a first portion of the interconnect layer, a protective layer formed overlying the dielectric layer without covering the first portion of the interconnect layer, and a bump formed overlying and electrically connected to the first portion of the interconnect layer. In some embodiments, the dielectric layer includes a silicon nitride layer, and the interconnect layer includes copper.

In accordance with another aspect of the exemplary embodiments, a packaging assembly includes a semiconductor device electrically coupled to a substrate through a solder joint structure. The semiconductor device includes a post-passivation interconnect (PPI) structure, a dielectric layer formed on the PPI structure without covering a first portion of the PPI structure, and a protective layer formed on the dielectric layer without covering the first portion of the PPI structure. The substrate includes a conductive region; and the solder joint structure is formed between the first portion of the PPI structure and the conductive region of the substrate.

In accordance with the other aspect of the exemplary embodiments, a method includes forming a first polymer layer overlying a semiconductor substrate; forming an interconnect layer overlying the first polymer layer; forming a dielectric layer on the exposed surfaces of the interconnect layer and the first polymer layer; forming a second polymer layer on the dielectric layer; forming an opening in the second polymer layer to expose a portion of the dielectric layer; removing the exposed portion of the dielectric layer so as to expose a first portion of the interconnect layer; and forming a bump over the first portion of the interconnect layer.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device, comprising:
   a semiconductor substrate;
   a passivation layer overlying the semiconductor substrate;
   an interconnect layer overlying the passivation layer;
   a dielectric layer formed overlying the interconnect layer without covering a first portion of the interconnect layer, wherein the dielectric layer comprises nitride, wherein the dielectric layer extends into a recess in the interconnect layer;
   a protective layer formed overlying the dielectric layer without covering the first portion of the interconnect layer, wherein the protective layer extends into a recess in the dielectric layer; and
   a bump formed overlying and electrically connected to the first portion of the interconnect layer.

2. The semiconductor device of claim 1, wherein the dielectric layer comprises a silicon nitride layer.

3. The semiconductor device of claim 1, further comprising a metallization layer between the bump and the first portion of the interconnect layer.

4. The semiconductor device of claim 3, wherein the metallization layer comprises a titanium-containing layer and a copper-containing layer.

5. The semiconductor device of claim 1, wherein the protective layer comprises a polymer layer.

6. The semiconductor device of claim 1, wherein the interconnect layer comprises a copper layer or a copper alloy layer.

7. The semiconductor device of claim 1, further comprising another protective layer between the interconnect layer and the passivation layer.

8. The semiconductor device of claim 7, wherein the another protective layer comprises a polymer layer.

9. The semiconductor device of claim 7, wherein the dielectric layer extends to the surface of the another protective layer.

10. The semiconductor device of claim 1, wherein the bump is a solder bump.

11. A packaging assembly, comprising a semiconductor device electrically coupled to a substrate through a solder joint structure,
wherein the semiconductor device comprises:
   a post-passivation interconnect (PPI) structure;
   a dielectric layer formed on the PPI structure without covering a first portion of the PPI structure; and
   a protective layer formed on the dielectric layer without covering the first portion of the PPI structure, wherein the protective layer extends into a recess in the PPI structure,
wherein the substrate comprises a conductive region, wherein an uppermost region of the conductive layer is substantially coplanar with an uppermost region of the substrate; and
wherein the solder joint structure is formed between the first portion of the PPI structure and the conductive region of the substrate.

12. The packaging assembly of claim 11, wherein the dielectric layer comprises silicon nitride.

13. The packaging assembly of claim 11, wherein the PPI structure comprises a copper layer or a copper alloy layer.

14. The packaging assembly of claim 11, further comprising a metallization layer between the solder joint structure and the first portion of the PPI structure.

15. The packaging assembly of claim 11, wherein the metallization layer comprises a titanium-containing layer and a copper-containing layer.

16. The packaging assembly of claim 11, wherein the protective layer comprises a polymer layer.

17. A semiconductor device, comprising:
   a substrate;
   a passivation layer over the substrate;
   a post passivation interconnect (PPI) layer over the passivation layer, the PPI layer comprising a landing pad region;
   an anti-oxidation layer over the PPI layer, wherein the anti-oxidation layer exposes the landing pad region, and a thickness of the anti-oxidation layer is less than or equal to about 3 microns ($\mu m$), wherein the anti-oxidation layer extends into a recess in the PPI layer; and
   a protective layer formed over the anti-oxidation layer, wherein the protective layer exposes the landing pad region, and wherein the protective layer extends into the recess in the PPI structure.

18. The semiconductor device of claim 17, further comprising an interconnect structure between the substrate and the passivation layer, wherein the PPI layer is electrically connected to a top conductive layer of the interconnect structure.

19. The semiconductor device of claim 17, further comprising a bump structure on the landing pad region, wherein the bump structure comprises:
   an under bump metallurgy (UBM) layer over the landing pad region; and
   a solder bump over the UBM layer.

20. The semiconductor device of claim 19, wherein the UBM layer comprises at least one of titanium, tantalum, titanium nitride, tantalum nitride, copper, copper alloy, nickel, tin, or gold.

* * * * *